US011411385B2

(12) United States Patent
Zheng et al.

(10) Patent No.: US 11,411,385 B2
(45) Date of Patent: Aug. 9, 2022

(54) TIMING LEAKAGE PROTECTION CIRCUIT AND DEVICE CONTAINING SAME

(71) Applicant: KEDU ELECTRIC CO., LTD., Zhejiang (CN)

(72) Inventors: Chunkai Zheng, Zhejiang (CN); Yingxian Li, Zhejiang (CN)

(73) Assignee: KEDU ELECTRIC CO., LTD., Wenzhou (CN)

( * ) Notice: Subject to any disclaimer, the term of this patent is extended or adjusted under 35 U.S.C. 154(b) by 0 days.

(21) Appl. No.: 17/341,383

(22) Filed: Jun. 8, 2021

(65) Prior Publication Data

US 2021/0296880 A1    Sep. 23, 2021

(30) Foreign Application Priority Data

Dec. 3, 2020   (CN) .......................... 202022862000.6

(51) Int. Cl.
*H02H 3/00*   (2006.01)
*H02H 3/16*   (2006.01)
*G01R 31/52*  (2020.01)
*H02H 1/00*   (2006.01)

(52) U.S. Cl.
CPC .............. *H02H 3/16* (2013.01); *G01R 31/52* (2020.01); *H02H 1/0007* (2013.01)

(58) Field of Classification Search
None
See application file for complete search history.

(56) References Cited

U.S. PATENT DOCUMENTS

| 9,350,162 B2 * | 5/2016 | Bettenwort ............. H02H 3/16 |
| 2015/0311697 A1 * | 10/2015 | Faxvog .................... H02H 7/04 361/35 |

FOREIGN PATENT DOCUMENTS

| CN | 104993452 A | 10/2015 |
| CN | 106253216 B | 11/2018 |
| EP | 3240130 A1 | 11/2017 |

* cited by examiner

*Primary Examiner* — Stephen W Jackson

(57) ABSTRACT

A timing leakage protection circuit and a device containing the same. The timing leakage protection circuit includes a sensing unit, a switching unit, a ground fault circuit interrupter (GFCI) control unit, a switching control unit and an adjustable timing unit. The sensing unit and switching unit are used to be connected in series in a circuit to be protected. The switching control unit is configured to receive a control signal output by the GFCI control unit and control the switching unit to be open when receiving the control signal, so as to interrupt a circuit to be protected. Compared to the traditional leakage protection circuit, the circuit provided herein further has a timing function, so that the timing period can be controlled correspondingly according to different voltages, thereby reducing the circuit complexity and cost.

8 Claims, 3 Drawing Sheets

TIMING LEAKAGE PROTECTION CIRCUIT AND DEVICE CONTAINING SAME

CROSS-REFERENCE TO RELATED APPLICATIONS

This application claims the benefit of priority from Chinese Patent Application No. 202022862000.6, filed on Dec. 3, 2020. The content of the aforementioned application, including any intervening amendments thereto, is incorporated herein by reference in its entirety.

TECHNICAL FIELD

This application relates to electrical safety, and more particularly to a timing leakage protection circuit and a device containing the same.

BACKGROUND

A ground fault circuit interrupter (GFCI) system can be applied in plugs, sockets and circuits. The GFCI system will break the circuits when it detects that the current flows in an unexpected route, such as through a human body into the earth, thereby providing a leakage protection. However, the advancement of society brings a higher demand for the leakage protection device. With respect to those devices that need to be turned off at a specific time, the leakage protection device is required to have both timing and leakage protective functions. However, the existing device with the leakage protection and timing functions has a complicated circuit, which greatly increases the operation cost.

SUMMARY

An object of this application is to provide a timing leakage protection circuit to solve technical problems in prior art to a certain extent. Compared to the traditional leakage protection circuit, the circuit provided herein further has a timing function, so that the timing period can be controlled correspondingly according to different voltages, thereby reducing the circuit complexity and cost.

Another object of this application is to provide a timing leakage protection device.

Technical solutions of this application are described as follows.

In a first aspect, this application provides a timing leakage protection circuit, comprising:
a sensing unit;
a switching unit;
a ground fault circuit interrupter (GFCI) control unit;
a switching control unit; and
an adjustable timing unit;
wherein the sensing unit and the switching unit are used to be connected in series in a circuit to be protected; and the sensing unit is configured to sense current information of the circuit to be protected;
a first input end of the GFCI control unit is connected to the sensing unit; the GFCI control unit is configured to obtain the current information sensed by the sensing unit and determine whether an electric leakage occurs in the circuit to be protected according to the current information; and the GFCI control unit is also configured to output a control signal when an electric leakage occurs in the circuit to be protected;
a first input end of the switching control unit is connected to a control output end of the GFCI control unit; an output end of the switching control unit is connected to the switching unit; and the switching control unit is configured to receive the control signal output by the GFCI control unit and control the switching unit to be open when receiving the control signal, so as to interrupt the circuit to be protected; and the adjustable timing unit is connected to a second input end of the GFCI control unit; the adjustable timing unit is configured to adjust its own output voltage; the GFCI control unit is configured to collect the output voltage of the adjustable timing unit and obtain and collect a timing period corresponding to the collected output voltage; and the GFCI control unit is also configured to output the control signal to the switching control unit after the timing period is up, so as to allow the switching control unit to control the switching unit to be open, thereby interrupting the circuit to be protected.

In the timing leakage protection circuit provided herein, the sensing unit and the switching unit are connected in series in the circuit to be protected; the GFCI control unit is configured to obtain the current information sensed by the sensing unit to output the control signal when determining the occurrence of the electric leakage in the circuit to be protected; the switching control unit controls the switching unit to be open according to the received control signal, thereby interrupting the circuit to be protected; the adjustable timing unit is configured to adjust the output voltage; and the GFCI control unit outputs the control signal to the switching control unit after the timing period corresponding to the adjusted output voltage is up, so that the switching control unit controls the switching unit to be open according to the received control signal, thereby interrupting the circuit to be protected. Therefore, the timing leakage protection circuit provided herein has an additional timing function with respect to the traditional leakage protection circuit, so that the timing period can be controlled correspondingly according to different voltages, thereby reducing the circuit complexity and cost.

In an embodiment, the adjustable timing unit comprises a potentiometer and a mechanical knob; the potentiometer is connected to the second input end of the GFCI control unit; the mechanical knob is connected to the potentiometer; the potentiometer is configured to output a voltage; and the mechanical knob is configured to adjust the voltage output from the potentiometer.

In an embodiment, the GFCI control unit comprises a controller; wherein the first input end, the control output end and the second input end of the GFCI control unit is provided on the controller; the potentiometer comprises a first fixed contact and a second fixed contact; the adjustable timing unit further comprises an electric brush; one end of the electric brush is connected to the mechanical knob, and the other end of the electric brush is in contact with the potentiometer; a control output end of the controller is connected to the electric brush; the first fixed contact of the potentiometer is connected to a power end, and the second fixed contact of the potentiometer is connected to ground; the mechanical knob is configured to be rotatable; when the mechanical knob is rotated, the electric brush is driven to rotate to change a contact position between the electric brush and the potentiometer, thereby adjusting the voltage output from the potentiometer.

In an embodiment, the timing leakage protection circuit further comprises a first power supply unit and a second power supply unit;
wherein an input end of the first power supply unit is connected to a power input end of the circuit to be protected;

an output end of the first power supply unit is connected to a third input end of the GFCI control unit; and the first power supply unit is configured to supply power for the GFCI control unit; and an input end of the second power supply unit is connected to the power input end of the circuit to be protected; an output end of the second power supply unit is connected to a second input end of the switching control unit; and the second power supply unit is configured to supply power for the switching control unit.

In an embodiment, the timing leakage protection circuit further comprises a testing unit;

wherein the testing unit is used to be connected in series in the circuit to be protected; and the testing unit is configured to perform a leakage simulation test on the timing leakage protection circuit.

In an embodiment, the switching unit is a solenoid.

In a second aspect, this application provides a timing leakage protection device, comprising the above-mentioned timing leakage protection circuit.

Through the arrangement of the above timing leakage protection circuit, the timing leakage protection device can also control the timing period correspondingly according to different voltages, thereby reducing the circuit complexity and cost In an embodiment, the timing leakage protection device further comprises a marking component;

wherein the adjustable timing unit comprises a potentiometer and a mechanical knob; the mechanical knob is connected to the potentiometer; the mechanical knob is configured to adjust a voltage output from the potentiometer; the mechanical knob has a plurality of scales respectively corresponding to a plurality of timing periods; the marking component is provided adjacent to the mechanical knob; the marking component is configured to indicate each of the plurality of scales on the mechanical knob; and the plurality of timing periods respectively corresponding to the plurality of scales corresponds to a plurality of timing periods corresponding to voltages output from the potentiometer in a one-to-one correspondence.

Figure 1:
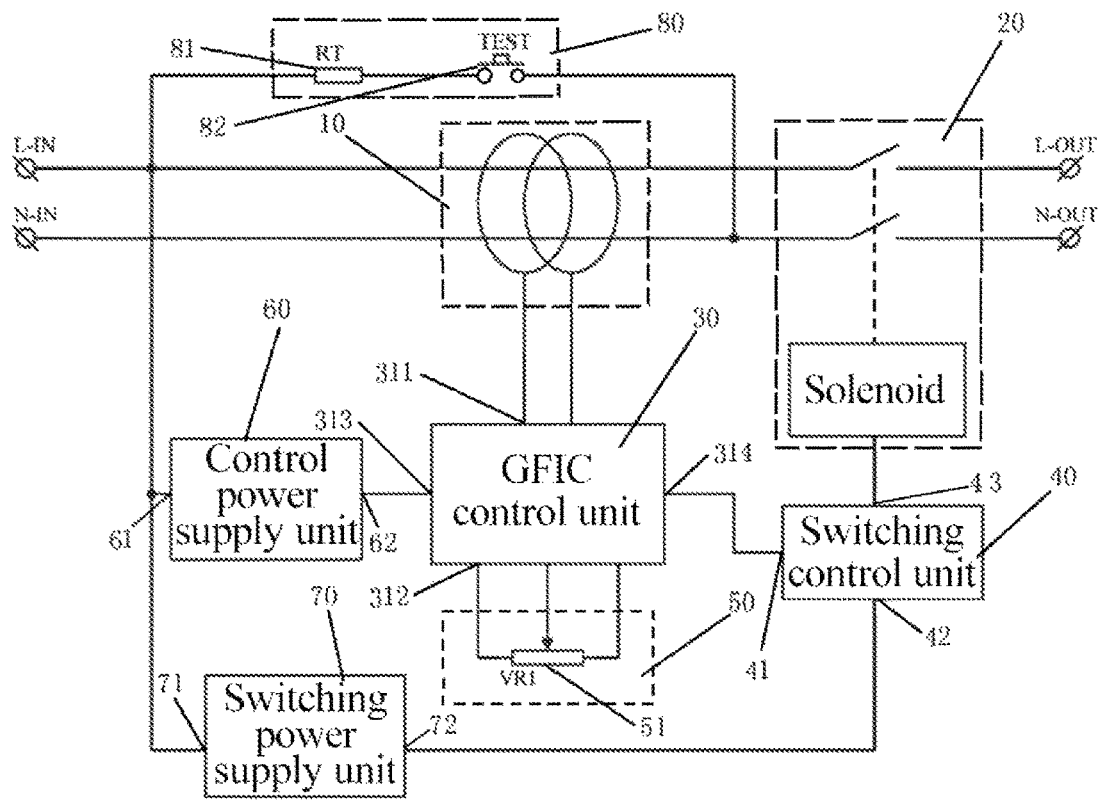
FIG. 1 is a block diagram of a timing leakage protection circuit according to an embodiment of the present disclosure.

In this drawings: 10, sensing unit; 11, transformer; 20, switching unit; 30, ground fault circuit interrupter (GFCI) control unit; 31, controller; 311, first input end of the GFCI control unit; 312, second input end of the GFCI control unit; 313, third input end of the GFCI control unit; 314, control output end of the GFCI control unit; 40, switching control unit; 41, first input end of the switching control unit; 42, second input end of the switching control unit; 43, output end of the switching control unit; 50, adjustable timing unit; 51, potentiometer; 511, first fixed contact; 512, second fixed contact; 52, mechanical knob; 521, scale; 53, electric brush; 531, through hole; 54, connection piece; 541, groove; 542, protrusion; 60, first power supply unit; 61, input end of the first power supply unit; 62, output end of the first power supply unit; 70, second power supply unit; 71, input end of the second power supply unit; 72, output end of the second power supply unit; 80, testing unit; 81, test resistor; 82, test button; 90, marking component; $I_1$, first current; $I_2$, second current, 100, timing leakage protection device; and 200, timing leakage protection circuit.

DETAILED DESCRIPTION OF EMBODIMENTS

The embodiments of the present application are described in detail below with reference to the accompanying drawings, in which the same reference numerals indicate the same or similar elements. The described embodiments below are only illustrative, and are not intended to limit the scope of the application.

The disclosure will be further described in detail below with reference to the accompanying drawings and embodiments to make the technical solutions better understood. It should be understood that these embodiments are exemplary and should not be considered as limitation to the disclosure. The exemplary embodiments provided herein are used to facilitate the understanding of the application, and also to make the scope of the application clear to those skilled in the art.

The technical solutions of the present application will be further described in detail with reference to the accompanying drawings and embodiments.

A timing leakage protection circuit 200 and a timing leakage protection device 100 of the present disclosure will be illustrated with reference to the accompanying drawings.

Referring to an embodiment shown in FIG. 1, a timing leakage protection circuit 200 includes a sensing unit 10, a switching unit 20, a ground fault circuit interrupter (GFCI) control unit 30, a switching control unit 40 and an adjustable timing unit 50.

The sensing unit 10 and the switching unit 20 are used to be connected in series in a circuit to be protected. The sensing unit 10 is configured to sense current information of the circuit to be protected. A first input end of the GFCI control unit 313 is connected to the sensing unit 10. The GFCI control unit 30 is configured to obtain the current information sensed by the sensing unit 10 and determine whether an electric leakage occurs in the circuit to be protected according to the current information. The GFCI control unit 30 is also configured to output a control signal when an electric leakage occurs in the circuit to be protected. A first input end of the switching control unit 41 is connected to a control output end of the GFCI control unit 314. An output end of the switching control unit 43 is connected to the switching unit 20. The switching control unit 40 is configured to receive the control signal output by the GFCI control unit 30 and control the switching unit 20 to be open when receiving the control signal, so as to interrupt the circuit to be protected. The adjustable timing unit 50 is connected to a second input end of the GFCI control unit 312. The adjustable timing unit 50 is configured to adjust its output voltage. The GFCI control unit 30 is configured to collect the output voltage of the adjustable timing unit 50 and obtain and collect a timing period corresponding to the collected output voltage. The GFCI control unit 30 is also configured to output the control signal to the switching control unit 40 after the timing period is up, so as to allow the switching control unit 40 to control the switching unit 20 to be open, thereby interrupting the circuit to be protected.

Figure 2:
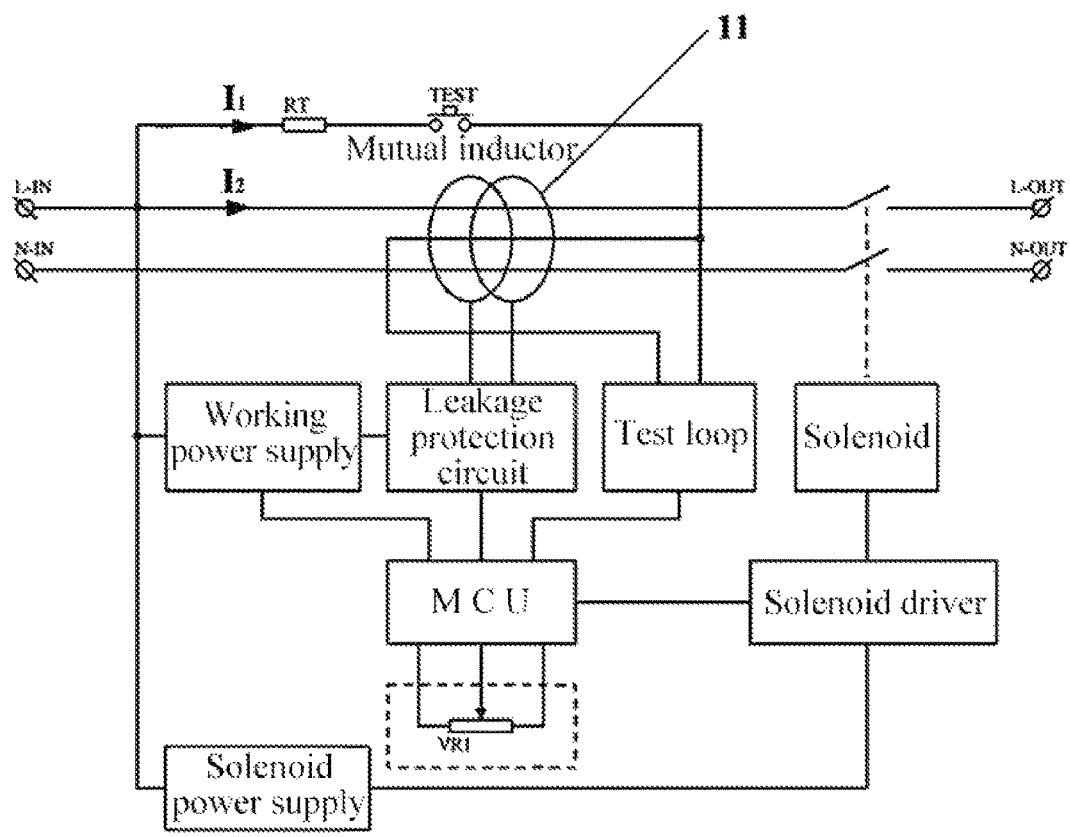
FIG. 2 is a block diagram of the timing leakage protection circuit according to another embodiment of the present disclosure.

Referring to an embodiment shown in FIG. 2, the sensing unit 10 includes a transformer 11. The transformer 11 is configured to sense the amount of current in the circuit to be protected. For example, the transformer 11 detects the current flowing from an input end to an output end of the circuit to be protected is different from that flowing from the input end to the output end of the circuit to be protected, which indicates an electric leakage occurs in the circuit to be protected. The GFCI control unit 30 outputs the control signal to the switching control unit 40, so as to allow the switching control unit 40 to control the switching unit 20 to be open, thereby interrupting the circuit to be protected.

Referring to an embodiment shown in FIG. 2, the switching unit 20 is a solenoid. The switching control unit 40 drives the switching unit 20 to be open after receiving the control signal output by the GFCI control unit 30, thereby interrupting the current flowing from the input end of the circuit to be protected to a load in the circuit to be protected to prevent people or objects from being shocked.

Figure 4:
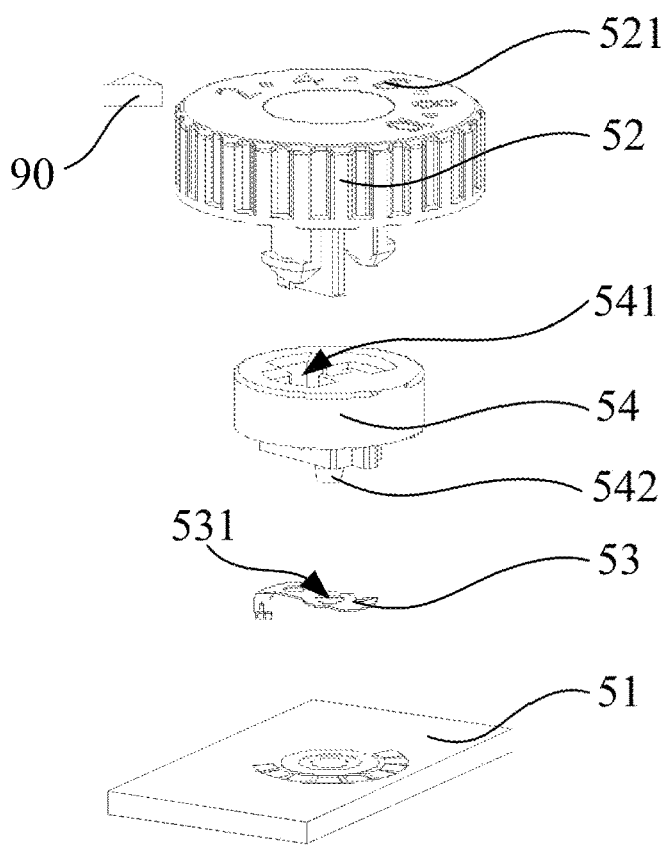
FIG. 4 is a schematic diagram of an adjustable timing unit according to an embodiment of the present disclosure.

Referring to an embodiment shown in FIG. 4, the adjustable timing unit 50 includes a potentiometer 51 (potentiometer VR1) and a mechanical knob 52. The potentiometer 51 is connected to the second input end of the GFCI control unit 30. The mechanical knob 52 is connected to the potentiometer 51. The potentiometer 51 is configured to output a voltage. The mechanical knob 52 is configured to adjust the voltage output from the potentiometer 51.

As an embodiment, the potentiometer 51 can also be replaced by a carbon film circuit board for time setting, which is not specifically limited by this application.

Figure 3:
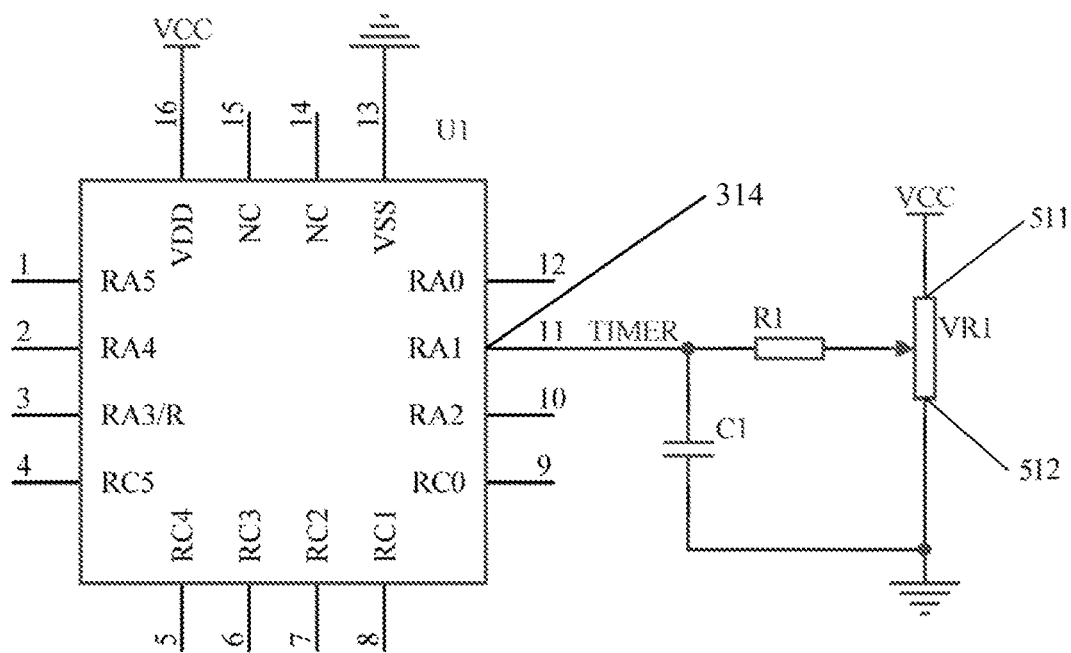
FIG. 3 is a schematic diagram showing a principle of the timing leakage protection circuit according to an embodiment of the present disclosure.

In an embodiment, as shown in FIG. 3, the GFCI control unit 30 includes a controller 31 (controller U1). The control output end of the GFCI control unit 314 is a control output end of the controller 31. The potentiometer 51 includes a first fixed contact 511 and a second fixed contact 512. The adjustable timing unit 50 further includes an electric brush 53. One end of the electric brush 53 is connected to the mechanical knob 52, and the other end of the electric brush is in contact with the potentiometer 51. The control output end of the controller 31 is connected to the electric brush 53. The first fixed contact 511 of the potentiometer 51 is connected to a power end, and the second fixed contact 512 of the potentiometer 51 is connected to ground. The mechanical knob 52 is configured to be rotatable. When the mechanical knob is rotated, the electric brush 53 is driven to rotate to change a contact position between the electric brush 53 and the potentiometer 51, thereby adjusting the voltage output from the potentiometer 51.

Referring to an embodiment shown in FIG. 4, the adjustable timing unit 50 also includes a connection piece 54. One end of the connection piece 54 is connected to the mechanical knob 52, and the other end of the connection piece 54 is connected to the electric brush 53, so as to realize the connection between the mechanical knob 52 and the electric brush 53.

Referring to an embodiment shown in FIG. 4, the connection piece 54 is provided with a groove 541. A portion of the mechanical knob 52 is inserted into the groove 541 to realize the connection between the mechanical knob 52 and the connection piece 54.

Referring to an embodiment shown in FIG. 4, the end of the connection piece 54 facing away from the mechanical knob 52 is provided with a protrusion 542. The electric brush 53 is provided with a through hole 531. The electric brush 53 is sleeved on the protrusion 542 of the connection piece 54 through the through hole 531 to realize the connection between the connection piece 54 and the electric brush 53.

In an embodiment, there are a plurality of protrusions 542 and a plurality of through holes 531. The plurality of protrusions 542 and the plurality of through holes 531 are in one-to-one correspondence to enable the connection between the connection piece 54 and the electric brush 53 to become more reliable. In another embodiment, there are two protrusions 542 and two through holes 531, which are in one-to-one correspondence to enable the connection between the connection piece 54 and the electric brush 53 to become more reliable.

Referring to an embodiment shown in FIGS. 3-4, the mechanical knob 52 is rotated to drive the electric brush 53 to rotate through the connection piece 54. The electric brush 53 is rotated to enable the contact position of the electric brush 53 and the potentiometer 51 to change. The change of the contact position of the electric brush 53 and the potentiometer 51 make a partial voltage obtained by the potentiometer 51 change, thereby causing a change of the output voltage of the potentiometer 51. In addition, the GFCI control unit 30 collects the output voltage of the potentiometer 51 of the adjustable timing unit 50 and also obtains the timing period corresponding to the collected output voltage. Therefore, the change of the output voltage of the potentiometer 51 causes a change of the timing period obtained by the GFCI control unit 30. In a specific embodiment shown in FIG. 3, the controller 31 is provided with the control output end of the controller 31. The control output end of the controller 31 is the control output end of the GFCI control unit 314. The control output end of the controller 31 is connected to the electric brush 53 through a first resistor R1. The first fixed contact 511 of the potentiometer 51 is connected to the power end, and the second fixed contact 512 of the potentiometer 51 is connected to the ground. The control output end of the controller 31 is also connected to the second fixed contact 511 of the potentiometer 51 through a first capacitor C1.

As an embodiment, the adjustable voltage of the potentiometer 51 is assumed to have a range from 0 to 5 V. The controller 31 sets the corresponding timing period according to the obtained voltage value. The voltages of 1, 2, 3, 4 and 5 V correspond to the timing period of 2, 4, 6, 8 and 10 h, respectively. After the timing period is up, the controller 31 outputs the control signal to the switching control unit 40, so as to allow the switching control unit 40 to control the switching unit 20 to be open, thereby interrupting the current flowing from the input end of the circuit to be protected to the load in the circuit to be protected to stop the circuit to be protected.

In an embodiment, the timing leakage protection circuit 200 further includes a first power supply unit 60 and a second power supply unit 70. An input end of the first power supply unit 61 is connected to a power input end of the circuit to be protected. An output end of the first power supply unit 62 is connected to a third input end of the GFCI control unit 313. The first power supply unit 60 is configured to supply power for the GFCI control unit 30. An input end of the second power supply unit 71 is connected to the power input end of the circuit to be protected. An output end of the second power supply unit 72 is connected to a second input end of the switching control unit 42. The second power supply unit 70 is configured to supply power for the switching control unit 40.

It should be noted that the first power supply unit 60 includes an alternating current-direct current (AC-DC) power supply module.

It should be noted that in an embodiment, the controller 31 is a microcontroller unit. In the timing leakage protection circuit 200, the mechanical knob 52 is controlled to operate the potentiometer 51 to adjust the voltage output from the potentiometer 51. The microcontroller unit in the GFCI control unit 30 collects the adjusted output voltage to obtain the timing period corresponding to the adjusted output voltage, so that the GFCI control unit 30 has a timing function. Therefore, the adjustable timing unit 50 does not need to add the AC-DC power supply module, which reduces a complexity of the timing leakage protection circuit 200 to enable structure of the timing leakage protection circuit 200 to become simple.

In an embodiment, the timing leakage protection circuit 200 further includes a testing unit 80. The testing unit 80 is used to be connected in series in the circuit to be protected. The testing unit 80 is configured to perform a leakage simulation test on the timing leakage protection circuit 200.

According to an embodiment shown in FIGS. 1-2, the testing unit 80 includes a test resistor RT 81 and a test button TEST 82. The test button TEST 82 is configured to control start and stop of the testing unit 80. The test button TEST 82 can be pressed to achieve switch between start and stop of the testing unit 80. Specifically, a situation of leakage of electricity is simulated by pressing the test button TEST 82. In the situation, the switching unit 20 is open, which indicates the timing leakage protection circuit 200 has a perfect leakage protection function. Otherwise, there are loopholes in the timing leakage protection circuit 200.

Referring to an embodiment shown in FIG. 2, the electric leakage is simulated as follows. The test button TEST 82 is pressed to enable the test resistor RT 81 and the test button TEST 82 to be connected in the circuit to be protected. At this time, the current output from the output end (L-IN end) of the circuit to be protected is divided into a first current $I_1$ and a second current $I_2$. The first current $I_1$ flows to the test resistor RT 81, and the second current $I_2$ flows to the transformer 11. Both the first current $I_1$ and the second current $I_2$ flow back to the input end (N-IN end) of the circuit to be protected through the transformer 11. Therefore, the transformer 11 firstly detects that the current flowing from the L-IN end to the transformer 11 is the second current $I_2$. Then the transformer also detects that the currents flowing the transformer 11 to the N-IN end are the first current $I_1$ and the second current $I_2$. That is, the current flowing into the transformer 11 is not the same as the current flowing back into the transformer 11. At this time, the GFCI control unit 30 outputs the control signal to the switching control unit 40, so as to allow the switching control unit 40 to control the switching unit 20 to be open, thereby interrupting the circuit to be protected.

As an embodiment shown in FIG. 2, the testing unit 80 also includes a test loop. The test loop can be automatically connected to perform a simulation test for the circuit to be protected, so as to determine whether there are loopholes in the timing leakage protection circuit 200.

As an embodiment shown in FIG. 2, the test loop can be connected at a fixed time interval to automatically perform a periodic simulation test. When the periodic simulation test is automatically carried out, if the transformer 11 detects that the current flowing into the transformer 11 is not the same as the current flowing back into the transformer 11, the transformer 11 sends a signal to the GFCI control unit 30, which indicates the timing leakage protection circuit 200 has a perfect leakage protection function. Otherwise, there are loopholes in the timing leakage protection circuit 200. When the periodic simulation test is automatically carried out, the GFCI control unit 30 does not output the control signal to the switching control unit 40, causing the switching control unit 40 cannot control the switching unit 20 to be open to fail to interrupt the circuit to be protected. That is, when the periodic simulation test is automatically performed, the circuit to be protected has been operating normally.

In conclusion, in the timing leakage protection circuit 200, the sensing unit 10 and the switching unit 20 are used to be connected in series in the circuit to be protected. The GFCI control unit 30 is configured to obtain the current information sensed by the sensing unit 10 to output the control signal when determining the occurrence of the electric leakage in the circuit to be protected. The switching control unit 40 controls the switching unit 20 to be open according to the received control signal, thereby interrupting the circuit to be protected. The adjustable timing unit 50 is configured to adjust the voltage. The GFCI control unit 30 outputs the control signal to the switching control unit 40 after the timing period corresponding to the adjusted output voltage is up, so as allow the switching control unit 40 to control the switching unit 20 to be open according to the received control signal, thereby interrupting the circuit to be protected. Therefore, the timing leakage protection circuit provided herein has an additional timing function with respect to the traditional leakage protection circuit, so that the timing period can be controlled correspondingly according to different voltages, thereby reducing the circuit complexity and cost.

Figure 5:
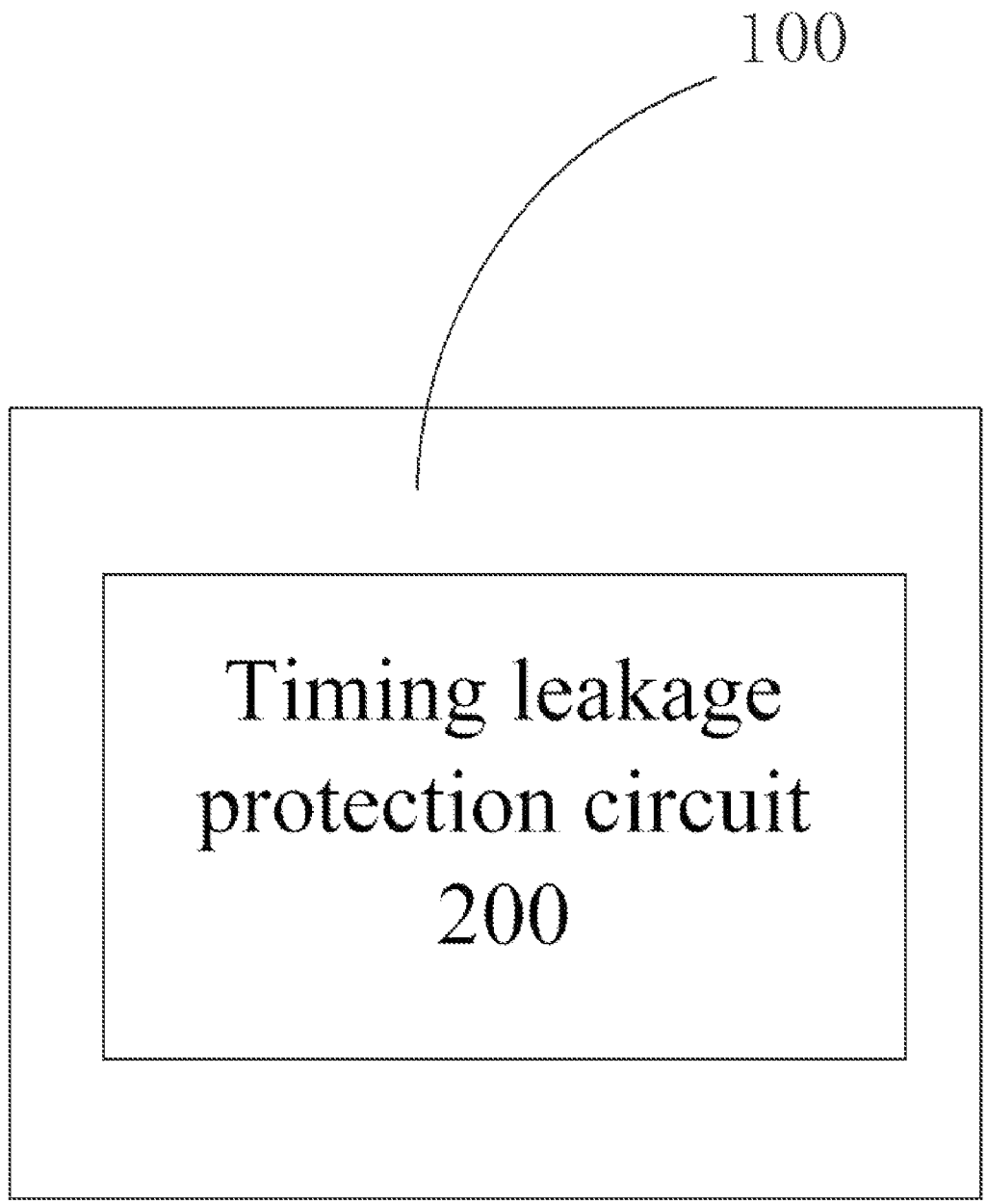
FIG. 5 is a block diagram of a timing leakage protection device according to an embodiment of the present disclosure.

As shown in FIG. 5, this application provides a timing leakage protection device 100, including the above-mentioned timing leakage protection circuit 200.

Through the arrangement of the above timing leakage protection circuit, the timing leakage protection device 100 can also control the timing period correspondingly according to different voltages, thereby reducing the circuit complexity and cost.

Referring to an embodiment shown in FIG. 4, the mechanical knob 52 has a plurality of scales 521 respectively corresponding to a plurality of timing periods. The timing leakage protection device further includes a marking component 90. The marking component 90 is configured to indicate each of the plurality of scales 521 on the mechanical knob 52. The plurality of timing periods respectively corresponding to the plurality of scales 521 corresponds to a plurality of periods timing respectively corresponding to the voltages output from the potentiometer 51 in a one-to-one correspondence. Specifically, the marking component 90 can be, but is not limited to an arrow.

In an embodiment, the timing leakage protection device 100 further includes a panel. The mechanical knob 52 and the marking component 90 are provided on the panel.

The plurality of scales 521 on the mechanical knob 52 represents different timing periods, which are 2, 4 6, 8 and 10 h. When the voltage output from the potentiometer 51 is 2 V, the marking component 90 indicates a scale 521 corresponding to 4 h. After 4 h is up, the controller 31 outputs the control signal to the switching control unit 40, so as to the switching control unit 40 to control the switching unit 20 to be open, thereby interrupting the current flowing from the input end of the circuit to be protected to the load in the circuit to be protected to stop the circuit to be protected.

It should be noted that the timing leakage protection device 100 can display the timing period without a digital tube or a liquid crystal screen, which reduces the cost and ensures a good user experience.

Through the arrangement of the above timing leakage protection circuit, the timing leakage protection device 100 can also control the timing period correspondingly according to different voltages, thereby reducing the circuit complexity and cost of the timing leakage protection circuit 200.

In the description of this disclosure, it should be understood that the terms "centre", "longitudinal direction", "transversal", "length", "width", "thickness", "up", "down", "front", "back", "left", "right", "vertical", "horizontal", "top", "bottom", "clockwise direction", "anticlockwise direction" etc. are only used to explain the relative position relationship, movement situation, etc. between the components under a certain attitude (as shown in the attached figure), but are not intended to indicate or imply that the devices or elements must have a specific orientation and configuration and operation. Therefore, these terms cannot be understood as limitations of the application.

In addition, the terms such as "first" and "second" are only for descriptive purposes, and cannot be understood as indicating or implying the relative importance or implicitly indicate the number of technical features. Thus, the features defined by "first" and "second" may explicitly or implicitly include at least one of the features. In the description of the present disclosure, unless specified, the phrase "a plurality of" means at least two.

In the present invention, unless specified, terms "install", "connect", "link", "fix" and the like should be understood broadly. For embodiment, "fix" may result in a fixed connection, a detachable connection, or an integrated configuration of elements. The elements may be connected mechanically or electrically; or directly connected or indirectly connected through an intermediate medium. Alternatively, two elements may be in communication or interact with each other unless specified. For the skilled in the art, the specific meanings of the above terms in the present invention can be understood according to specific conditions.

In the present invention, unless specified, a first feature is "above" or "below" a second feature, which may indicates the first feature and the second feature have a direct contact, or the first feature and the second feature are an indirect contact through other features. In addition, the "above", "over" and "top" indicates that the first feature is directly and diagonally above the second feature, or the horizontal height of the first feature is higher than the second feature. The "below", "under" and "bottom" indicates that the first feature is directly and diagonally below the second feature, or the horizontal height of the first feature is less than that of the second feature.

In the description, reference terms "an embodiment", "some embodiments" "typical embodiment", "specific embodiment", "some typical embodiments" and the like means that the at least one of embodiments of the present invention describes the specific features, structures, materials or characteristics. In the description, the schematic representation of the above-mentioned terms should not be understood as necessarily referring to the same embodiment. In addition, the described specific features, structures, materials or characteristics in each of the embodiments can be combined in a suitable manner by those skilled in the art.

The above are only preferred embodiments of this application, and are not intended to limit this application. Any modification, equivalent replacement and improvement made within the spirit and principle of this application shall fall within the protection scope of this application.

What is claimed is:

1. A timing leakage protection circuit, comprising:
 a sensing unit;
 a switching unit;
 a ground fault circuit interrupter (GFCI) control unit;
 a switching control unit; and
 an adjustable timing unit;
 wherein the sensing unit and the switching unit are used to be connected in series in a circuit to be protected; and the sensing unit is configured to sense current information of the circuit to be protected;
 a first input end of the GFCI control unit is connected to the sensing unit; the GFCI control unit is configured to obtain the current information sensed by the sensing unit and determine whether an electric leakage occurs in the circuit to be protected according to the current information; and the GFCI control unit is also configured to output a control signal when an electric leakage occurs in the circuit to be protected;
 a first input end of the switching control unit is connected to a control output end of the GFCI control unit; an output end of the switching control unit is connected to the switching unit; and the switching control unit is configured to receive the control signal output by the GFCI control unit and control the switching unit to be open when receiving the control signal, so as to interrupt the circuit to be protected; and
 the adjustable timing unit is connected to a second input end of the GFCI control unit; the adjustable timing unit is configured to adjust its own output voltage; the GFCI control unit is configured to collect the output voltage of the adjustable timing unit and obtain and collect a timing period corresponding to the collected output voltage; and the GFCI control unit is also configured to output the control signal to the switching control unit after the timing period is up, so as to the switching control unit to control the switching unit to be open, thereby interrupting the circuit to be protected.

2. The timing leakage protection circuit of claim 1, wherein the adjustable timing unit comprises a potentiometer and a mechanical knob; the potentiometer is connected to the second input end of the GFCI control unit; the mechanical knob is connected to the potentiometer; the potentiometer is configured to output a voltage; and the mechanical knob is configured to adjust the voltage output from the potentiometer.

3. The timing leakage protection circuit of claim 2, wherein the GFCI control unit comprises a controller; a first input end, a control output end and the second input end of the GFCI control unit is provided on the controller; the potentiometer comprises a first fixed contact and a second fixed contact; the adjustable timing unit further comprises an electric brush; one end of the electric brush is connected to the mechanical knob, and the other end of the electric brush is in contact with the potentiometer; a control output end of the controller is connected to the electric brush; the first fixed contact of the potentiometer is connected to a power end, and the second fixed contact of the potentiometer is connected to ground; the mechanical knob is configured to be rotatable; when the mechanical knob is rotated, the electric brush is driven to rotate to change a contact position between the electric brush and the potentiometer, thereby adjusting the voltage output from the potentiometer.

4. The timing leakage protection circuit of claim 3, further comprising:
 a first power supply unit and a second power supply unit;
 wherein an input end of the first power supply unit is connected to a power input end of a circuit to be protected; an output end of the first power supply unit is connected to a third input end of the GFCI control unit; and the first power supply unit is configured to supply power for the GFCI control unit; and an input end of the second power supply unit is connected to the power input end of a circuit to be protected; an output end of the second power supply unit is connected to a second input end of a switching control unit; and the second power supply unit is configured to supply power for the switching control unit.

5. The timing leakage protection circuit of claim 1, further comprising:

a testing unit;

wherein the testing unit is used to be connected in series in the circuit to be protected; and the testing unit is configured to perform a leakage simulation test on the timing leakage protection circuit.

6. The timing leakage protection circuit of claim 1, wherein the switching unit is a solenoid.

7. A timing leakage protection device, comprising: the timing leakage protection circuit of claim 1.

8. The timing leakage protection device of claim 7, further comprising:

a marking component;

wherein the adjustable timing unit comprises a potentiometer and a mechanical knob; the mechanical knob is connected to the potentiometer; the mechanical knob is configured to adjust a voltage output from the potentiometer; the mechanical knob has a plurality of scales respectively corresponding to a plurality of timing periods; the marking component is provided adjacent to the mechanical knob; the marking component is configured to indicate each of the plurality of scales on the mechanical knob; and the plurality of timing periods respectively corresponding to the plurality of scales corresponds to a plurality of timing periods corresponding to voltages output from the potentiometer in a one-to-one correspondence.

\* \* \* \* \*